(12) United States Patent
Lee et al.

(10) Patent No.: US 11,415,819 B2
(45) Date of Patent: Aug. 16, 2022

(54) BEAM STEERING APPARATUS AND SYSTEM INCLUDING THE SAME

(71) Applicant: SAMSUNG ELECTRONICS CO., LTD., Suwon-si (KR)

(72) Inventors: Duhyun Lee, Yongin-si (KR); Bochul Park, Seoul (KR); Sunil Kim, Osan (KR); Junghyun Park, Seoul (KR); Byunggil Jeong, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 172 days.

(21) Appl. No.: 16/860,527

(22) Filed: Apr. 28, 2020

(65) Prior Publication Data

US 2021/0149227 A1    May 20, 2021

(30) Foreign Application Priority Data

Nov. 20, 2019 (KR) .................... 10-2019-0149879

(51) Int. Cl.
*G02F 1/017* (2006.01)
*G02B 6/12* (2006.01)
(Continued)

(52) U.S. Cl.
CPC .......... *G02F 1/01708* (2013.01); *B82Y 10/00* (2013.01); *B82Y 20/00* (2013.01);
(Continued)

(58) Field of Classification Search
CPC .. G02F 1/01708; G02F 1/01791; G02F 3/026; G02B 2006/12078
See application file for complete search history.

(56) References Cited

U.S. PATENT DOCUMENTS 9,983,419 B1    5/2018 Lee et al.
10,468,561 B2   11/2019 Kim
(Continued)

FOREIGN PATENT DOCUMENTS

JP    5462196 B2    4/2014
JP    2019-15925 A  1/2019
(Continued)

OTHER PUBLICATIONS

Montoya et al., "Optical phased-array ladar", Applied Optics, vol. 53, No. 31, Nov. 1, 2014, pp. 7551-7555, 5 pages total.
(Continued)

*Primary Examiner* — Sung H Pak
(74) *Attorney, Agent, or Firm* — Sughrue Mion, PLLC (57) ABSTRACT

A beam steering apparatus includes a substrate; at least one light source provided on the substrate; a first waveguide configured to transmit a first light beam radiated from the at least one light source; at least one beam splitter configured to split the first light beam transmitted by the first waveguide to obtain a second light beam; a second waveguide configured to receive the second light beam; and a quantum dot optical amplifier provided on the second waveguide and comprising a barrier layer, a quantum dot layer, and a wetting layer, the quantum dot optical amplifier being configured to modulate a phase of the second light beam, and to amplify an intensity of the second light beam.

19 Claims, 6 Drawing Sheets

(51) Int. Cl.
*B82Y 20/00* (2011.01)
*G02F 3/02* (2006.01)
*G02B 6/34* (2006.01)
*B82Y 10/00* (2011.01)

(52) U.S. Cl.
CPC .................. *G02B 6/12* (2013.01); *G02B 6/34* (2013.01); *G02F 3/026* (2013.01); *G02B 2006/12078* (2013.01); *G02F 1/01791* (2021.01)

(56) References Cited

U.S. PATENT DOCUMENTS

| | | | | |
|---|---|---|---|---|
| 2005/0045868 | A1* | 3/2005 | Otsubo | .......... H01S 5/341 257/14 |
| 2006/0071218 | A1* | 4/2006 | Takeda | .......... B82Y 20/00 257/79 |
| 2012/0172951 | A1 | 7/2012 | Choi | |

| | | | |
|---|---|---|---|
| 2013/0342683 | A1 | 12/2013 | Nelson et al. |
| 2015/0273085 | A1 | 10/2015 | Bawendi et al. |
| 2018/0052378 | A1* | 2/2018 | Shin ............. G01S 17/931 |

FOREIGN PATENT DOCUMENTS

| | | |
|---|---|---|
| KR | 101074882 B1 | 10/2011 |
| KR | 101616002 B1 | 5/2016 |
| KR | 10-2018-0020035 A | 2/2018 |
| KR | 101848075 B1 | 4/2018 |
| KR | 10-2018-0051186 A | 5/2018 |
| KR | 1020180130138 A | 12/2018 |
| KR | 102081894 B1 | 2/2020 |

OTHER PUBLICATIONS

Abedi et al., "Phase Recovery Acceleration in Quantum-Dot Semiconductor Optical Amplifiers", Journal of Lightwave Technology, vol. 30, No. 12, Jun. 15, 2012, pp. 1924-1930, 7 pages total.

* cited by examiner

BEAM STEERING APPARATUS AND SYSTEM INCLUDING THE SAME

CROSS-REFERENCE TO RELATED APPLICATION

This application claims priority from Korean Patent Application No. 10-2019-0149879, filed on Nov. 20, 2019, in the Korean Intellectual Property Office, the disclosure of which is incorporated herein by reference in its entirety.

BACKGROUND

1. Field

One or more example embodiments of the disclosure relate to beam steering apparatuses for carrying out optical amplification and phase modulation and systems including the same.

2. Description of the Related Art

An advanced driving assistance system (ADAS) having various functions has been commercially available. For example, increasingly, vehicles are equipped with functions such as adaptive cruise control (ACC) in which a location and a speed of another vehicle around a vehicle is detected to reduce a speed of the vehicle if there is a risk of collision or a vehicle is controlled to drive within a set speed range. Also, an autonomous emergency braking (AEB) system is provided in automatic braking is applied when a risk of collision with a vehicle ahead is detected but a driver does not properly respond to the risk. Also, vehicles capable of autonomous driving are expected to be commercialized in the near future.

Accordingly, there is a growing interest in optical detection apparatuses capable of providing information around a vehicle. For example, a light detection and ranging (LiDAR) for use in a vehicle may radiate laser to a selected area around the vehicle, detect the laser reflected from the selected area, and provide relevant information such as information on a distance, a relative speed, and an azimuth angle with respect to an object around the vehicle. To this end, the LiDAR may include a beam steering apparatus capable of steering a beam to a desired area.

To steer a laser beam to a desired location, a method of mechanically rotating a portion to which laser is radiated and/or a method of using the interference of a bundle of laser beams from multiple unit cells or multiple waveguides by using an optical phased array (hereinafter referred to as OPA) method is generally used. In the OPA method, a laser beam may be steered by electrically or thermally controlling unit cells or waveguides.

SUMMARY

One or more example embodiments provide beam steering apparatuses for carrying out optical amplification and phase modulation and systems including the same.

Additional aspects will be set forth in part in the description which follows and, in part, will be apparent from the description, or may be learned by practice of the presented embodiments of the disclosure.

According to an aspect of an example embodiment, there is provided a beam steering apparatus including: a substrate; at least one light source provided on the substrate; a first waveguide configured to transmit a first light beam radiated from the at least one light source; at least one beam splitter configured to split the first light beam transmitted by the first waveguide to obtain a second light beam; a second waveguide configured to receive the second light beam; and a quantum dot optical amplifier provided on the second waveguide and comprising a barrier layer, a quantum dot layer, and a wetting layer, the quantum dot optical amplifier being configured to modulate a phase of the second light beam, and to amplify an intensity of the second light beam.

The quantum dot optical amplifier may further include a first electrode layer provided on the barrier layer and a second electrode layer provided on the wetting layer.

The beam steering apparatus may further include a first spacer provided between the barrier layer and the first electrode layer, and a second spacer provided between the wetting layer and the second electrode layer.

The quantum dot optical amplifier may be further configured to modulate the phase of the second light beam and amplify the intensity of the second light beam based on a current applied to the quantum dot optical amplifier, the current ranging from $0.1 \times I_{th}$ to $1 \times I_{th}$, where $I_{th}$ is a threshold current.

Based on a charge supply to the quantum dot optical amplifier reaching a certain level or higher, a carrier density of the quantum dot layer in a ground state may be saturated and a substantially constant gain of the quantum dot optical amplifier may be maintained, and based on an increase of a carrier density of the wetting layer, the wetting layer may have a refractive index that is changed, upon which the phase of the second light beam is modulated.

The quantum dot layer may include a Group III-V semiconductor material.

The quantum dot layer may include InAs.

The wetting layer may include $In_{0.15}GaAs$.

In the quantum dot optical amplifier, the barrier layer, the quantum dot layer, and the wetting layer may be repeatedly stacked 2 to 30 times.

The beam steering apparatus may further include an antenna provided on an end portion of the second waveguide, the second waveguide extending from the quantum dot optical amplifier.

According to an aspect of an example embodiment, there is provided a system including: a beam steering apparatus including: a substrate; at least one light source provided on the substrate; a first waveguide configured to transmit a first light beam radiated from the at least one light source; at least one beam splitter configured to split the first light beam transmitted by the first waveguide to obtain a second light beam; a second waveguide configured to receive the second light beam; and a quantum dot optical amplifier provided on the second waveguide and comprising a barrier layer, a quantum dot layer, and a wetting layer, the quantum dot optical amplifier being configured to modulate a phase of the second light beam, configured to amplify an intensity of the second light beam; a receiver configured to receive the second light beam radiated from the beam steering apparatus toward an object and reflected therefrom; and a processor configured to classify and process a plurality of light beams irradiated toward the object in a plurality of directions based on at least one of a distribution-by-location and a distribution-by-time of the second light beam received by the receiver.

The quantum dot optical amplifier may further include a first electrode layer provided on the barrier layer and a second electrode layer provided on the wetting layer.

The beam steering apparatus may further include a first spacer provided between the barrier layer and the first electrode layer, and a second spacer provided between the wetting layer and the second electrode layer.

The quantum dot optical amplifier may be further configured to modulate the phase of the second light beam and amplify the intensity of the second light beam based on a current applied to the quantum dot optical amplifier, the current ranging from $0.1 \times I_{th}$ to $1 \times I_{th}$, where $I_{th}$ is a threshold current.

Based on a charge supply to the quantum dot optical amplifier reaching a certain level or higher, a carrier density of the quantum dot layer in a ground state may be saturated and a substantially constant gain of the quantum dot optical amplifier may be maintained, and based on an increase of a carrier density of the wetting layer, the wetting layer may have a refractive index that is changed, upon which the phase of the second light beam is modulated.

The quantum dot layer may include a Group III-V semiconductor material.

The quantum dot layer may include InAs.

The wetting layer may include $In_{0.15}GaAs$.

In the quantum dot optical amplifier, the barrier layer, the quantum dot layer, and the wetting layer may be repeatedly stacked 2 to 30 times.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Reference will now be made in detail to example embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects of the disclosure. As used herein, the term "and/or" includes any and all combinations of one or more of the associated listed items. Expressions such as "at least one of," when preceding a list of elements, modify the entire list of elements and do not modify the individual elements of the list.

Hereinafter, a beam steering apparatus and a system including the same according to one or more example embodiments will be described in detail with reference to the accompanying drawings. In the drawings below, the same reference numerals denote the same elements, and sizes of components in the drawings may be exaggerated for clarity and convenience. While such terms as "first" and "second" may be used to describe various components, such components must not be limited to the above terms. The above terms are used only to distinguish one component from another.

The singular forms "a," "an," and "the" as used herein are intended to include the plural forms as well, unless the context clearly indicates otherwise. When a portion is referred to as "including" an element, it is to be understood that the portion may further include other elements rather than excluding other elements as long as there is no particular opposing recitation. Sizes and thicknesses of components in the drawings may be exaggerated for clarity. When a material layer is referred to as being on a substrate or another layer, the material layer may directly contact the substrate or the other layer, or another third layer may be present therebetween. In the embodiments below, materials constituting each layer are exemplary, and thus, other materials may be used.

The terms " . . . unit" and "module" as used herein indicate a unit that processes at least one function or operation, and the unit may be implemented by hardware or software or by a combination of hardware and software.

The particular implementations shown and described herein are illustrative examples and are not intended to otherwise limit the technical scope in any way. For the sake of brevity, conventional electronics, control systems, software development, and other functional aspects of the systems may not be described in detail. Furthermore, the connecting lines or connectors shown in the various figures presented are intended to represent exemplary functional relationships and/or physical or logical couplings between the various elements. It should be noted that many alternative or additional functional relationships, physical connections or logical connections may be present in a practical device.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout.

The use of the terms "a," "an," and "the" and similar referents are to be construed to cover both the singular and the plural.

The operations of all methods described herein may be performed in any suitable order unless otherwise indicated herein or otherwise clearly contradicted by context. The use of any and all examples or exemplary language (e.g., etc.) provided herein is intended merely to better illuminate the technical spirit and does not pose a limitation on the scope of claims unless otherwise claimed.

Figure 1:
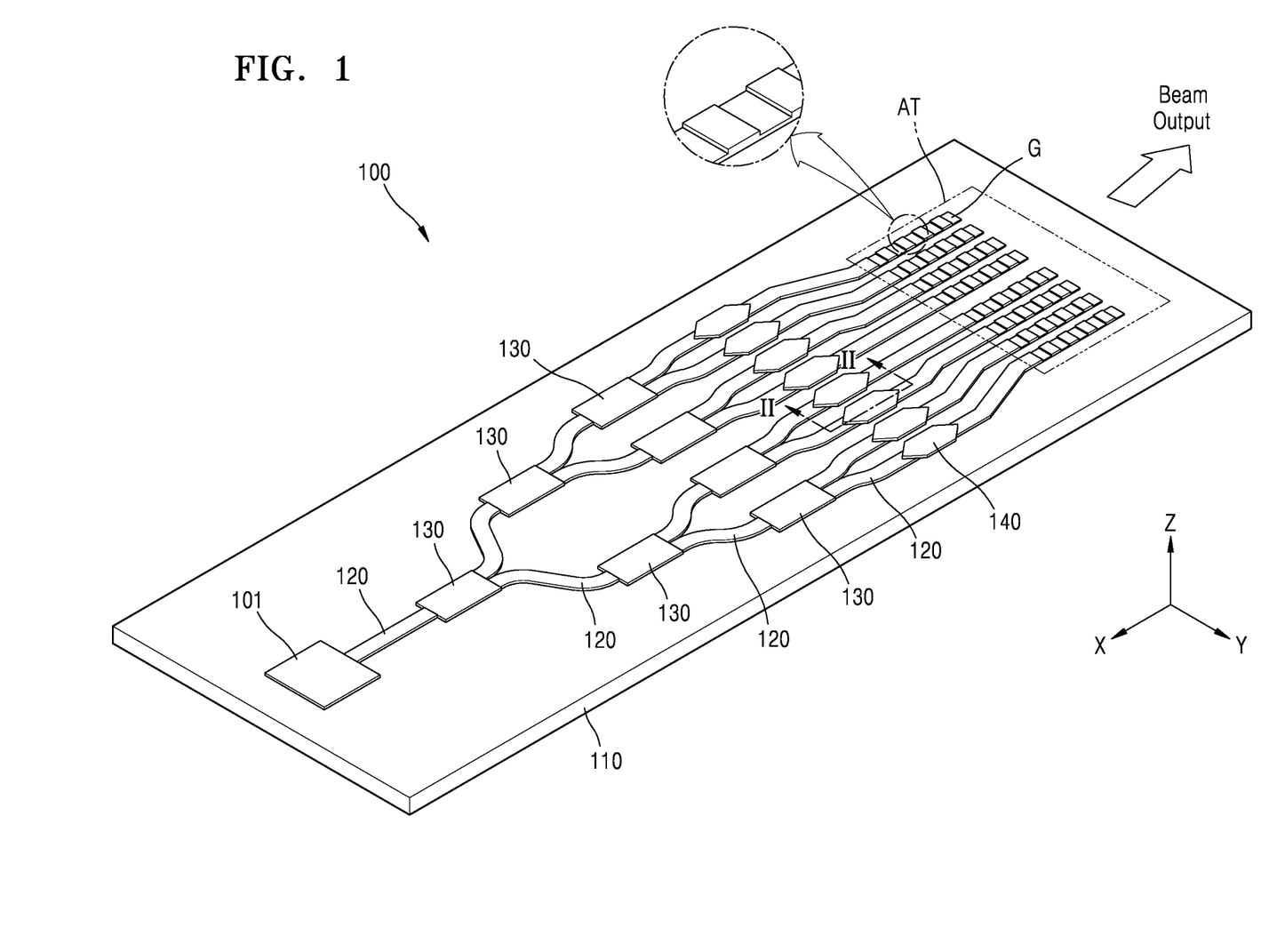
FIG. 1 is a schematic perspective view of a beam steering apparatus according to an example embodiment.

FIG. 1 shows a beam steering apparatus 100 according to an example embodiment.

The beam steering apparatus 100 may include a substrate 110, at least one light source 101 provided on the substrate 110, a waveguide 120 for transmitting a light beam radiated from the at least one light source 101, at least one beam splitter 130 for branching the light beam transmitted through the waveguide 120, and a quantum dot optical amplifier 140.

The substrate 110 may be, for example, a silicon substrate. However, this is merely an example, and accordingly, the substrate 110 may include various other materials. The light source 101 may include, for example, a laser diode (LD), a light-emitting diode (LED), a super luminescent diode (SLD), etc. Alternatively, for example, a tunable laser diode may be employed as a light source for radiating light of a plurality of wavelengths.

The waveguide 120 may be provided on the substrate 110. The waveguide 120 may include a plurality of waveguides 120 that are separated by beam splitters 130. FIG. 1 illustrates an example case in which one waveguide 120 on which light from the light source 101 is incident is branched into eight waveguides 120 by using seven beam splitters 130. However, the number and structure of the waveguide(s) 120 is not limited thereto and may be variously configured using the beam splitter 130.

The quantum dot optical amplifier 140 may be provided on the waveguides 120 separated by the beam splitters 130. The quantum dot optical amplifier 140 may modulate a phase of a light beam passing through the waveguide 120 and amplify intensity of the light beam. The quantum dot optical amplifier 140 may include a material whose refractive index changes when a current is applied and thus may change a phase. Each quantum dot optical amplifier 140 may be configured to modulate a phase independently. The quantum dot optical amplifier 140 may perform both phase modulation and optical amplification. Accordingly, a structure of a beam steering apparatus including the quantum dot optical amplifier 140 may be simplified compared to a case in which a device for phase modulation and a device for optical amplification are respectively provided.

A traveling direction of beams having phases modulated and output through the plurality of waveguides 120 may be determined by interference. A traveling direction of a beam by phase modulation may be adjusted in a direction parallel to the substrate 110 (e.g., horizontal direction). That is, beam steering in an X-Y plane may be performed in FIG. 1. By changing a phase of a beam passing through each waveguide 120, a traveling direction of the beam in a horizontal direction may be adjusted.

An antenna AT may be further provided on an end of the waveguide 120 extending from the quantum dot optical amplifier 140. The antenna AT may include a grating G formed in the waveguide 120. The antenna AT may adjust a traveling direction of a beam in a thickness direction of the substrate 110. For example, a traveling direction of a light beam may be adjusted according to a size, a depth, a pitch, etc. of the grating G. The quantum dot optical amplifier 140 may adjust a traveling direction of a light beam to scan the light beam in a direction horizontal to the substrate 110, and the antenna AT may adjust a traveling direction of a light beam to scan the light beam in a thickness direction of the substrate 110, thereby steering a light beam. The thickness direction of the substrate 110 may include not only a direction vertical to the substrate 110 but also an oblique direction to the substrate 110.

Figure 2:
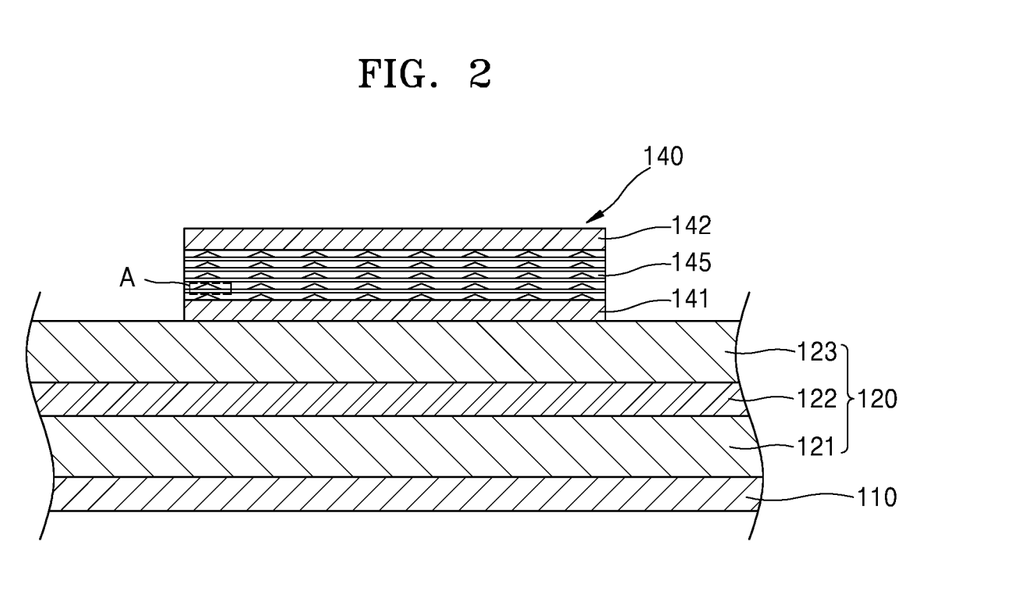
FIG. 2 is a cross-sectional view of the beam steering apparatus of FIG. 1, taken along line II-II of FIG. 1.

FIG. 2 is a cross-sectional view of the beam steering apparatus 100 of FIG. 1, taken along line II-II of FIG. 1.

Referring to FIG. 2, the waveguide 120 may include a first clad layer 121, a core layer 122, and a second clad layer 123. The core layer 122 may include a material having a greater refractive index than those of the first clad layer 121 and the second clad layer 123. In addition, the core layer 122 may include a material having a low absorption coefficient of light to be guided. The core layer 122 may include, for example but not limited to, silicon, silicon oxide, silicon nitride, or a polymer mineral substance. The first clad layer 121 and the second clad layer 123 may include different materials from each other. Alternatively, the first clad layer 121 and the second clad layer 123 may include the same material as each other. The first clad layer 121 and the second clad layer 123 may include, for example but not limited to, silicon oxide, silicon nitride, or a polymer mineral substance.

Figure 3:
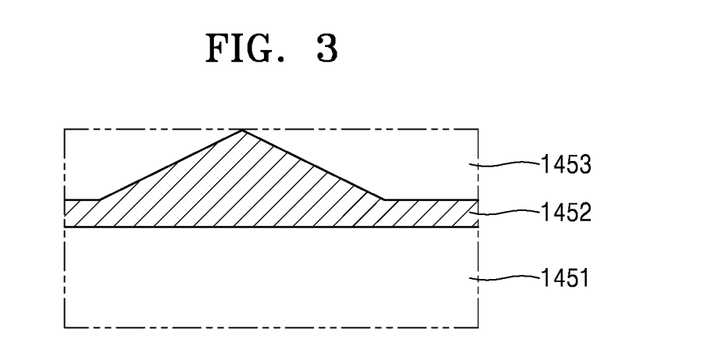
FIG. 3 is an enlarged view of portion A of FIG. 2.

The quantum dot optical amplifier 140 may include a gain layer 145. FIG. 3 is an enlarged view of portion A of the gain layer 145. Referring to FIG. 3, the gain layer 145 may include a barrier layer 1451, a quantum dot layer 1452, and a wetting layer 1453. The quantum dot layer 1452 may include a plurality of quantum dots. The barrier layer 1451 may include a Group III-V semiconductor material, for example, GaAs. The quantum dot layer 1452 may include a Group III-V semiconductor material. The quantum dot layer 1452 may include, for example, InAs. The wetting layer 1453 is an initial layer of atoms epitaxially grown on a surface where quantum dots are created. The wetting layer 1453 may include a Group III-V semiconductor material, for example, $In_{0.15}GaAs$.

Referring to FIG. 2, a first electrode layer 141 may be provided on the barrier layer 1451, and a second electrode layer 142 may be provided on the wetting layer 1453.

The gain layer 145 including the barrier layer 1451, the quantum dot layer 1452, and the wetting layer 1453 may be repeatedly stacked twice or more. For example, the gain layer 145 may be stacked 2 to 30 times.

Figure 4:
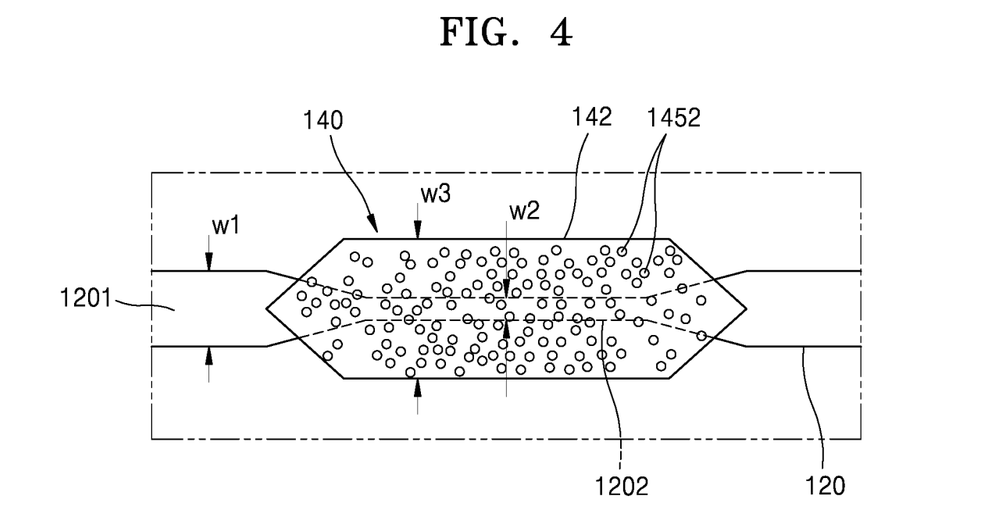
FIG. 4 is a plan view of the beam steering apparatus of FIG. 2.

FIG. 4 is a plan view of the beam steering apparatus of FIG. 2. The waveguide 120 may include a first portion 1201 having a first width w1 and a second portion 1202 having a second width w2 less than the first width w1. The quantum dot optical amplifier 140 may be provided on the second portion 1202 having the second width w2. The quantum dot optical amplifier 140 may have a third width w3 greater than the first width w1 of the waveguide 120. Thus, leakage of light may be reduced when a light beam transmitted through the waveguide 120 is moved towards the quantum dot optical amplifier 140.

However, a relationship between widths of the waveguide 120 and the quantum dot optical amplifier 140 is not limited thereto, and for example, widths of the waveguide 120 and the quantum dot optical amplifier 140 may be the same as each other.

Next, operations of the quantum dot optical amplifier 140 will be described.

Figure 5:
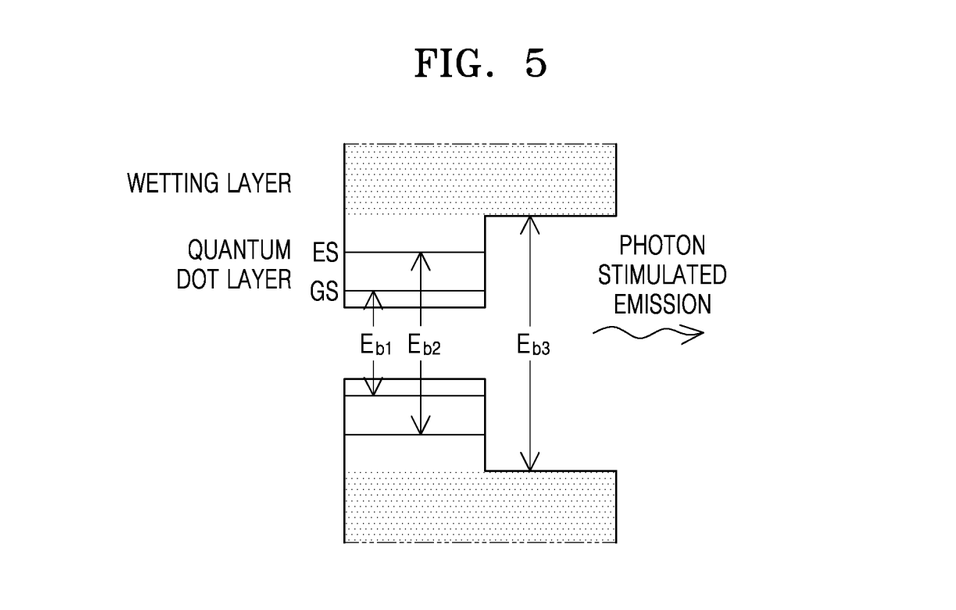
FIG. 5 shows an energy band diagram of a quantum dot optical amplifier of a beam steering apparatus according to an example embodiment.

FIG. 5 shows an energy band diagram of the quantum dot optical amplifier 140.

The wetting layer 1453 may include a material whose refractive index changes according to an application of a current.

When a current is applied to the quantum dot optical amplifier 140, charge is supplied to the quantum dot layer 1452 through the wetting layer 1453 to increase a carrier density in the quantum dot layer 1452. Density inversion in an excited state (ES) occurs due to an injection current, and accordingly, photon stimulated emission occurs due to transition into a ground state (GS). Thus, intensity of a beam may be amplified. However, the quantum dot layer 1452 has a property such that a carrier density does not increase in the GS any longer when a charge supply according to current application reaches a certain level or higher. In this case, no more charge is supplied to the quantum dot layer 1452, and charge is accumulated in the wetting layer 1453 to increase a carrier density of the wetting layer 1453. As a carrier density of the wetting layer 1453 increases, a refractive index of the wetting layer 1453 changes. When a refractive index of the wetting layer 1453 changes, a phase of a light beam passing through the quantum dot optical amplifier 140 may be modulated by evanescent wave interference. As described above, the quantum dot optical amplifier 140 may modulate a phase of a beam and amplify intensity of the beam. For example, phase modulation of a light beam as well as optical amplification may be performed by supplying a current ranging from $0.1 \times I_{th}$ to $1 \times I_{th}$ with respect to a threshold current $I_{th}$ to the quantum dot optical amplifier 140. The threshold current $I_{th}$ indicates a current at which stimulated emission of light starts to occur in the quantum dot layer 1452.

A wavelength of light subject to stimulated emission may be determined according to an energy band gap $E_{b1}$ in the GS of the quantum dot layer 1452. $E_{b2}$ indicates an energy band gap in the ES of the quantum dot layer 1452, and $E_{b3}$ indicates an energy band gap of the wetting layer 1453.

Figure 6:
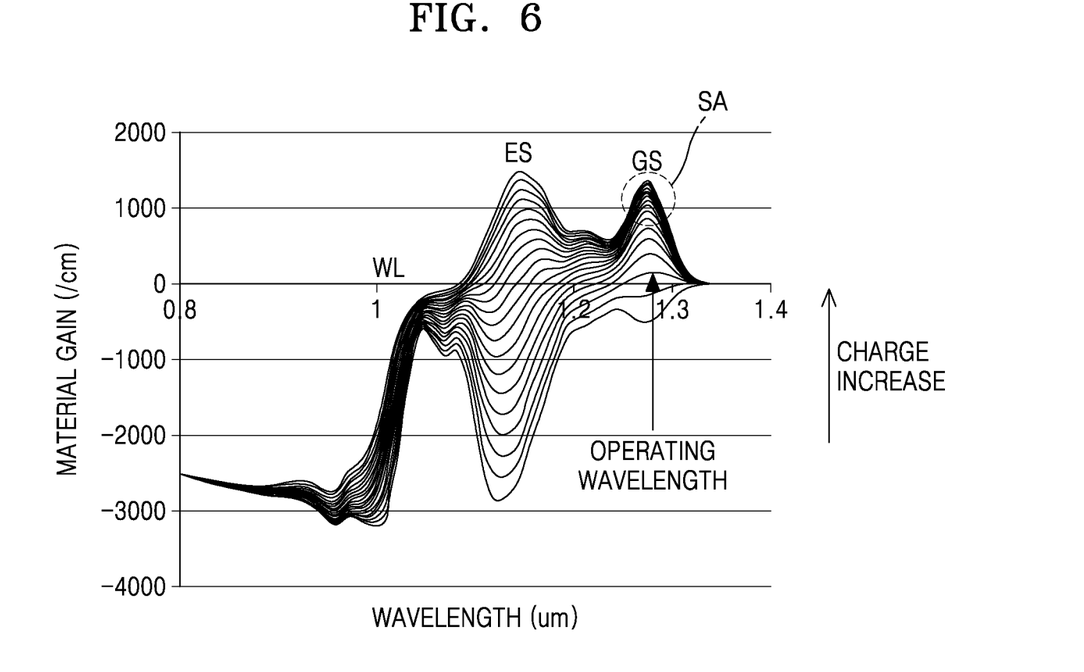
FIG. 6 shows a change in a material gain according to an optical wavelength when an amount of charge increases in a quantum dot optical amplifier of a beam steering apparatus according to an example embodiment.

FIG. 6 shows a change in a material gain according to a wavelength of a light beam when an amount of charge increases. Referring to FIG. 6, it may be seen that, in an operating wavelength range of about 1.3 μm, there is a section SA in which a material gain in a GS of the quantum dot layer 1452 initially increases with respect to an increase in an amount of charge and the material gain no longer increases and is saturated when the amount of charge reaches a certain amount of charge or greater. This shows that, when a charge supply according to current application reaches a certain level or higher in the quantum dot layer 1452, a carrier density in the GS of the quantum dot layer 1452 no longer increases. Accordingly, when a charge supply to a quantum dot optical amplifier reaches a certain level or higher, amplification of a light beam may be substantially constant.

Figure 7:
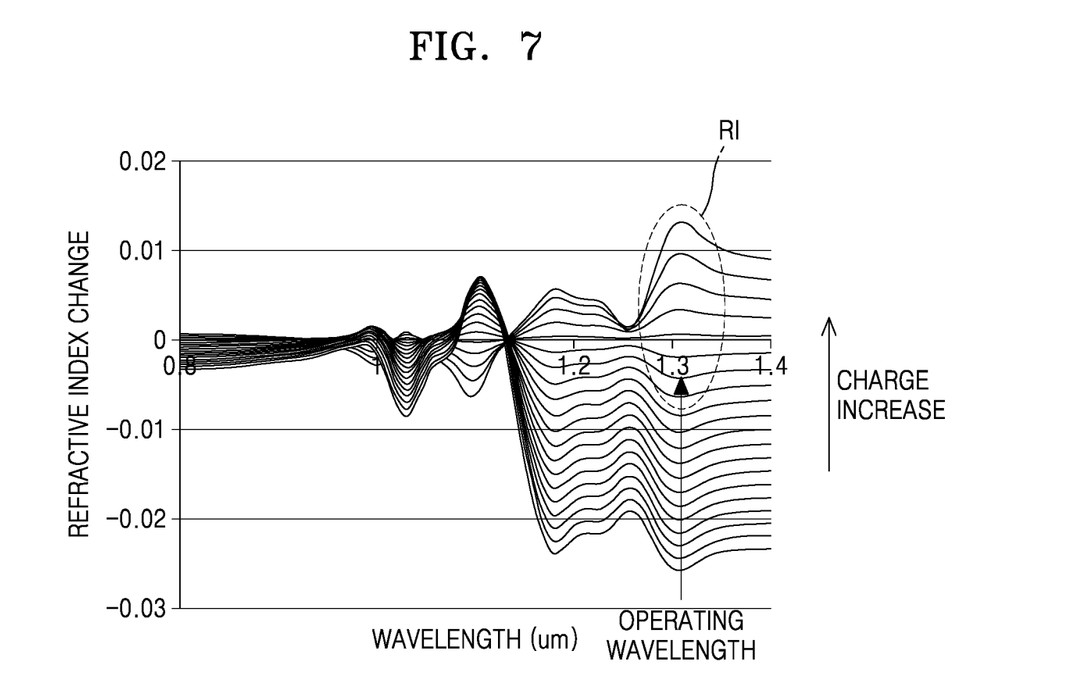
FIG. 7 shows a change in a refractive index according to an optical wavelength when an amount of charge increases in a quantum dot optical amplifier of a beam steering apparatus according to an example embodiment.

FIG. 7 shows a change in a refractive index of the wetting layer 1453 according to a wavelength of a light beam when an amount of charge increases. It may be seen that, in an operating wavelength range of about 1.3 μm, there is a section RI in which a width (or an amount) of the refractive index change increases. It may be seen that an amount of change in a refractive index of the wetting layer 1453 gradually increases in this section RI. This shows that, when a charge supply according to current application reaches a certain level or higher, a carrier density in the quantum dot layer 1452 no longer increases and a carrier density in the wetting layer 1453 increases, and thus, a refractive index of the wetting layer 1453 changes, and accordingly, a phase of a beam may be modulated.

Figure 8:
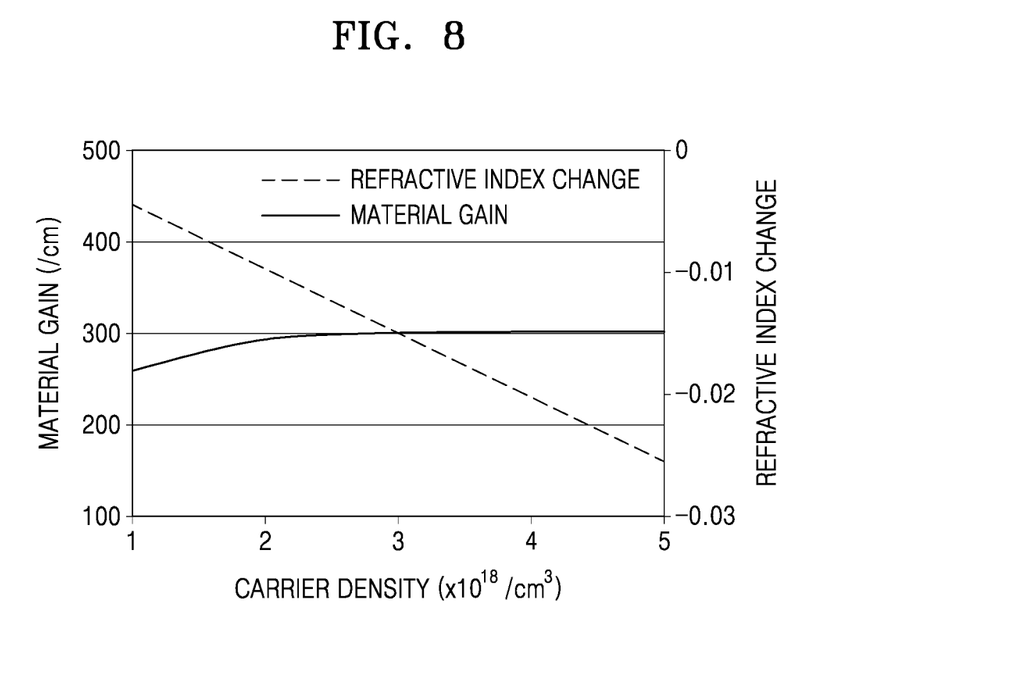
FIG. 8 shows a change in a material gain and a change in a refractive index according to a change in a carrier density of a quantum dot optical amplifier of a beam steering apparatus according to an example embodiment.

FIG. 8 shows a change in a material gain and a change in a refractive index together according to a change in a carrier density of the quantum dot optical amplifier 140 with respect to light in an operating wavelength range of about 1.3 μm, based on FIGS. 6 and 7. In FIG. 8, the dashed line shows a change in a refractive index of the wetting layer 1453, and the solid line shows a material gain of the quantum dot layer 1452. Referring to FIG. 8, as a carrier density increases, a material gain of the quantum dot layer 1452 is substantially constantly maintained, whereas an amount of change in a refractive index of the wetting layer 1453 substantially linearly changes. As described above, the quantum dot optical amplifier 140 may be configured to perform beam phase modulation caused by a change in a refractive index as well as optical amplification. In other words, when a carrier density increases due to a current applied to the quantum dot optical amplifier 140, the quantum dot optical amplifier 140 may be configured to limit an increase in a carrier density of the quantum dot layer 1452 in a ground state to maintain a substantially constant gain of the quantum dot optical amplifier 140, and when a carrier density of the wetting layer 1453 increases, change a refractive index of the wetting layer 1453 to modulate a phase of a light beam.

Referring to FIG. 1 again, a light beam is incident on one waveguide 120 and then is transmitted through the plurality of waveguides 120 branched by the beam splitters 130. In addition, the light beam is amplified and phase-modulated by the quantum dot optical amplifier 140 and is emitted, and the light beam may be radiated to a particular location by the interference of a bundle of light beams emitted in this way. Light beams passing through the waveguides 120 may be emitted with phases modulated by the quantum dot optical amplifier 140, and thus, a phase profile of a light beam may be determined. In addition, a traveling direction of the light beam with respect to a horizontal direction is determined according to the phase profile, and the light beam may be scanned in a direction horizontal to the substrate 110.

In the related art, in general, a method of changing a refractive index of a waveguide itself has been used to modulate a phase of a light beam passing through the waveguide. As a method for changing a refractive index of a waveguide, there are a method using heat and a method using electricity. In the method using heat, while phase change is dramatic, and a waveguide may be formed with various materials, there exist disadvantages in that phase modulation speed is low, waveguides are required to be at least a certain distance apart from each other due to severe interference between the waveguides, and it is difficult to obtain a wide field of view (FOV). In the method using electricity, although the phase modulation speed is high, and a wide FOV may be obtained because there is no interference between waveguides, a long waveguide is required due to a small phase change, and a waveguide material is limited to a semiconductor material such as Si because a p-n or p-i-n junction structure has to be applied, and these disadvantages make it impossible to steer laser beams of various wavelengths.

In the beam steering apparatus 100 according to an example embodiment, the quantum dot optical amplifier 140 may include the wetting layer 1453 whose refractive index changes according to current application around the waveguide 120 to modulate a phase of a light beam passing through the waveguide 120. Accordingly, in an example embodiment, a phase of a light beam passing through the waveguide 120 may be modulated due to evanescent wave interference by changing a refractive index of the wetting layer 1453 provided around the waveguide 120 instead of changing a refractive index of the waveguide 120 itself. Beam loss is insignificant because a refractive index of the waveguide 120 itself is not changed, and light beams of various wavelengths may be steered because various materials such as silicon or silicon nitride may be used as a material of the waveguide 120. Also, phase modulation speed is high because an electric signal is used instead of heat, and a wide FOV may be obtained because a gap between the waveguides 120 may be narrowed.

Also, according to an example embodiment, phase modulation as well as optical amplification may be performed by using one quantum dot optical amplifier 140, and thus, manufacturing cost may be reduced by decreasing the number of components and processes may also be simplified. It is also possible to miniaturize a beam steering apparatus.

Figure 9:
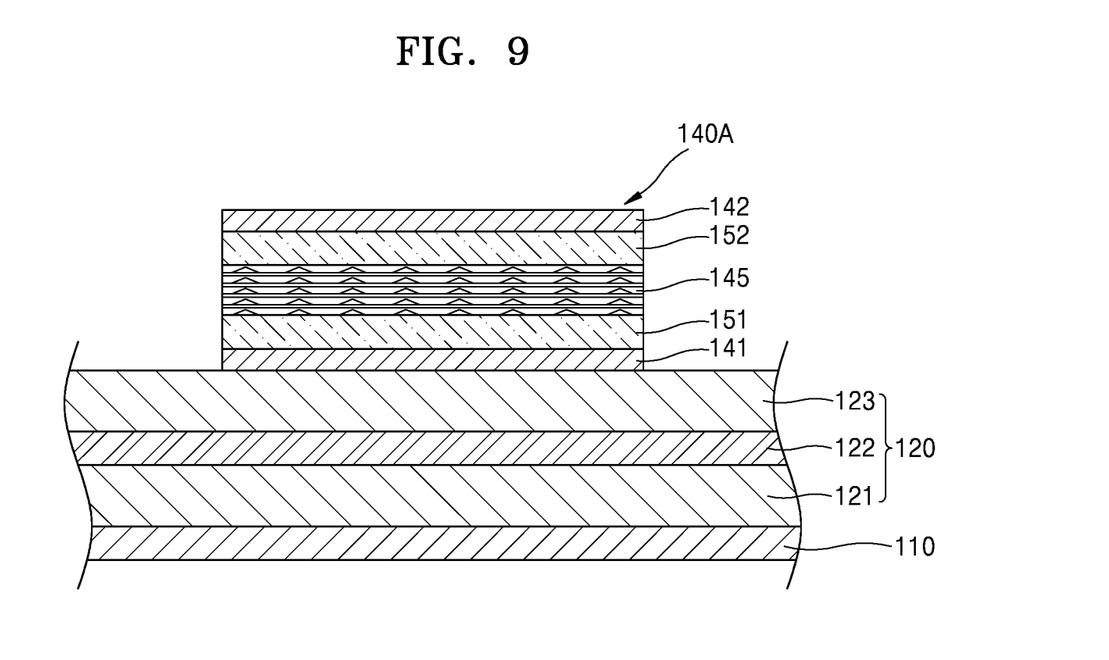
FIG. 9 shows an example in which a quantum dot optical amplifier shown in FIG. 2 further includes a spacer.

FIG. 9 shows an example in which the quantum dot optical amplifier shown in FIG. 2 further includes a spacer. Elements that are denoted by the same reference numerals as those in FIG. 2 are substantially the same as those described with reference to FIG. 2, and thus, a description thereof is omitted below. A quantum dot optical amplifier 140A may include a first spacer layer 151 between the barrier layer 1451, which is at a lower portion of the gain layer 145, and the first electrode layer 141, and a second spacer layer 152 between the wetting layer 1453, which is at an upper portion of the gain layer 145, and the second electrode layer 142.

The first spacer layer 151 and the second spacer layer 152 may be layers for adjusting an entire thickness of the quantum dot optical amplifier 140A. A proper optical amplification mode may be implemented by adjusting a thickness of the quantum dot optical amplifier 140A.

Figure 10:
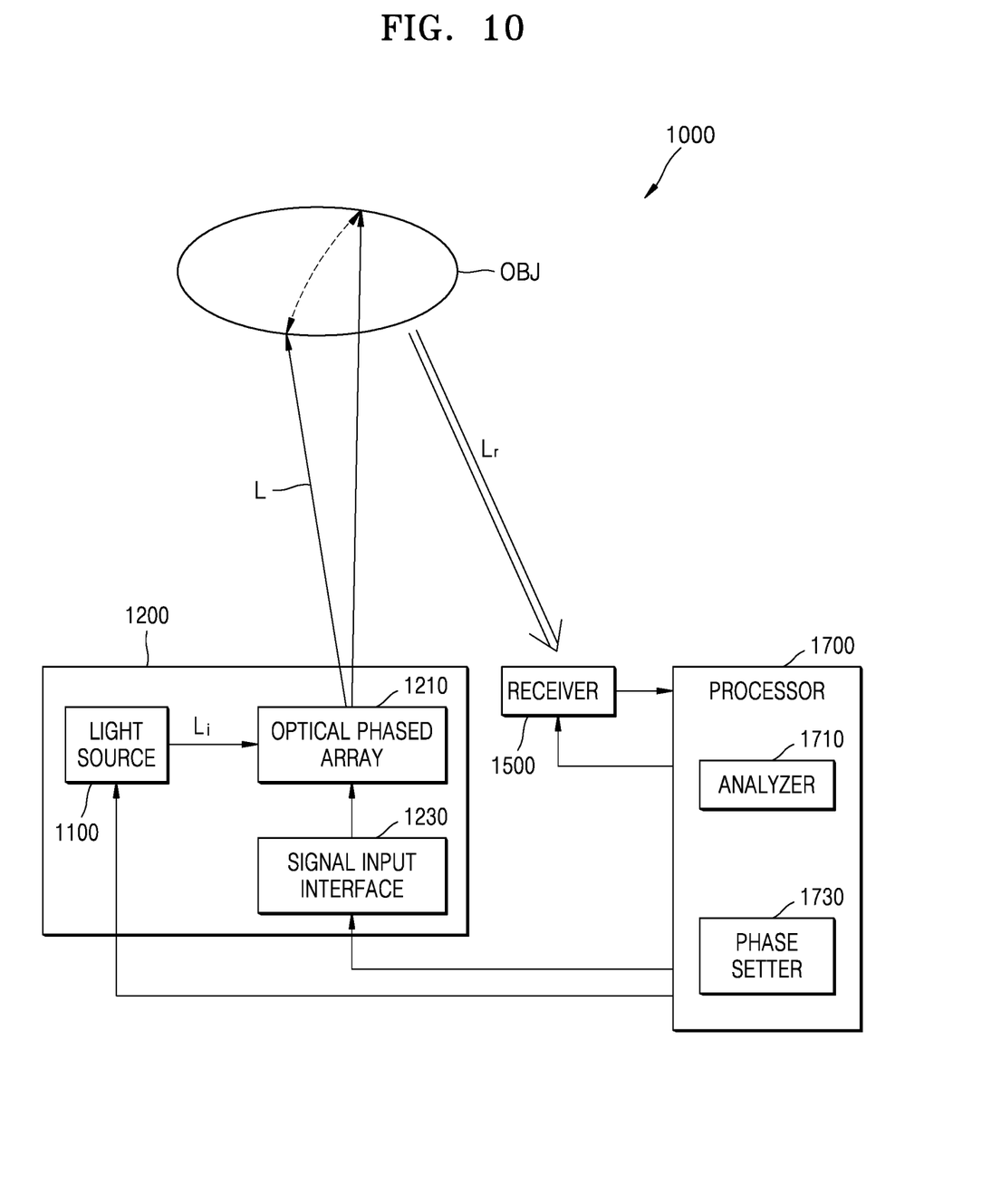
FIG. 10 is a block diagram of a system including a beam steering apparatus according to an example embodiment.

FIG. 10 is a schematic block diagram showing configurations of a system 1000 according to an example embodiment.

The system 1000 may include a beam steering apparatus 1200 for controlling a traveling direction of a light beam, a receiver 1500 for receiving a light beam radiated from the beam steering apparatus 1200 toward an object OBJ and reflected therefrom, and a processor 1700 for classifying and processing light radiated toward the object OBJ in a plurality of directions by analyzing, for example, distribution-by-location (or distribution of received light according to a location) and/or distribution-by-time (or distribution of received light according to time) of light received by the receiver 1500. For example, the receiver 1500 may include a light detector.

The beam steering apparatus 1200 may include a light source 1100 and at least one optical phased array (OPA) 1210 for emitting light towards the object OBJ in a plurality of directions by modulating a phase of a light beam $L_1$ from the light source 1100 and amplifying intensity of the light beam $L_1$. The OPA 1210 may include the waveguide 120, the beam splitter 130, and the quantum dot optical amplifier 140 as described with reference to FIG. 1. One or more of the example embodiments described with reference to FIGS. 1 to 9 may be applied to the beam steering apparatus 1200.

Based on the modulating the light beam $L_1$ from the light source 1100 and amplifying intensity of the light beam $L_1$, the OPA 1210 may radiate a light beam L toward the object OBJ to be used in analysis of a location and a shape of the object OBJ. The light source 1100 may generate and radiate pulse light or continuous light. For example, a variable wavelength light source may be used as the light source 1100.

The beam steering apparatus 1200 may adjust transverse scanning of light by modulating a phase of an incident light beam and may amplify intensity of the light beam. Also, the beam steering apparatus 1200 may adjust longitudinal scanning of light by adjusting the antenna AT (of FIG. 1) and a wavelength of the light source 1100. A signal input interface 1230 for applying a modulation signal to the beam steering apparatus 1200 may be provided. The beam steering apparatus 1200 may be controlled by the processor 1700.

The processor 1700 may control overall operations of the system 1000. The processor 1700 may include an analyzer 1710 for classifying and processing a light beam radiated from the beam steering apparatus 1200 toward the object OBJ to analyze, for example, distribution-by-location and distribution-by-time of light received by the receiver 1500.

The processor 1700 may also include a phase setter 1730 for setting a phase profile and controlling the signal input interface 1230 according to the phase profile to form a plurality of directions of emission of light from the beam steering apparatus 1200. In addition, the processor 1700 may control operations of the light source 1100 and the receiver 1500. For example, the processor 1700 may perform power supply control, on/off control, pulse wave (PW) or continuous wave (CW) generation control, etc. with respect to the light source 1100. The processor 1700 may include a microprocessor or a central processing unit (CPU).

The system 1000 may be applied to, for example, light detection and ranging (LiDAR). LiDAR may sense a distance toward an object, a direction, a speed, a temperature, a material distribution (or a material composition), and concentration characteristics of the object by radiating laser to the object. LiDAR may be used in a laser scanner and a three-dimensional (3D) image camera for an autonomous vehicle. Additionally, LiDAR may be applied to a LiDAR for use in a vehicle, a LiDAR for use in a robot, a LiDAR for use in a drone, etc.

In addition, a beam steering apparatus according to one or more example embodiments may be applied to, for example, an intruder detection system for security, a subway screen door obstacle detection system, a depth sensor, a user face recognition sensor in a mobile phone, augmented reality (AR), motion recognition in a television (TV) or an entertainment device, and object profiling.

A beam steering apparatus according to one or more example embodiments may perform optical amplification and phase modulation via a simple structure. The beam steering apparatus may steer an amplified light beam to a desired location. Such a beam steering apparatus may be used in various systems including LiDAR.

It should be understood that example embodiments described herein should be considered in a descriptive sense only and not for purposes of limitation. Descriptions of features or aspects within each embodiment should typically be considered as available for other similar features or aspects in other embodiments. While one or more example embodiments have been described with reference to the figures, it will be understood by those of ordinary skill in the art that various changes in form and details may be made therein without departing from the spirit and scope of the disclosure as defined by the following claims.

What is claimed is:

1. A beam steering apparatus comprising:
a substrate;
at least one light source provided on the substrate;
a first waveguide configured to transmit a first light beam radiated from the at least one light source;
at least one beam splitter configured to split the first light beam transmitted by the first waveguide to obtain a second light beam;
a second waveguide configured to receive the second light beam; and
a quantum dot optical amplifier provided on the second waveguide and comprising a barrier layer, a quantum dot layer, and a wetting layer, the quantum dot optical amplifier being configured to modulate a phase of the second light beam, and to amplify an intensity of the second light beam.

2. The beam steering apparatus of claim 1, wherein the quantum dot optical amplifier further comprises a first electrode layer provided on the barrier layer and a second electrode layer provided on the wetting layer.

3. The beam steering apparatus of claim 2, further comprising a first spacer provided between the barrier layer and the first electrode layer, and a second spacer provided between the wetting layer and the second electrode layer.

4. The beam steering apparatus of claim 1, wherein the quantum dot optical amplifier further is configured to modulate the phase of the second light beam and amplify the intensity of the second light beam based on a current applied to the quantum dot optical amplifier, the current ranging from $0.1 \times I_{th}$ to $1 \times I_{th}$, where $I_{th}$ is a threshold current.

5. The beam steering apparatus of claim 1, wherein, based on a charge supply to the quantum dot optical amplifier reaching a certain level or higher, a carrier density of the quantum dot layer in a ground state is saturated and a substantially constant gain of the quantum dot optical amplifier is maintained, and wherein, based on an increase of a carrier density of the wetting layer, the wetting layer has a refractive index that is changed, upon which the phase of the second light beam is modulated.

6. The beam steering apparatus of claim 1, wherein the quantum dot layer comprises a Group III-V semiconductor material.

7. The beam steering apparatus of claim 1, wherein the quantum dot layer comprises InAs.

8. The beam steering apparatus of claim 1, wherein the wetting layer comprises $In_{0.15}GaAs$.

9. The beam steering apparatus of claim 1, wherein, in the quantum dot optical amplifier, the barrier layer, the quantum dot layer, and the wetting layer are repeatedly stacked 2 to 30 times.

10. The beam steering apparatus of claim 1, further comprising an antenna provided on an end portion of the second waveguide, the second waveguide extending from the quantum dot optical amplifier.

11. A system comprising:
a beam steering apparatus comprising:
  a substrate;
  at least one light source provided on the substrate;
  a first waveguide configured to transmit a first light beam radiated from the at least one light source;
  at least one beam splitter configured to split the first light beam transmitted by the first waveguide to obtain a second light beam;
  a second waveguide configured to receive the second light beam; and
  a quantum dot optical amplifier provided on the second waveguide and comprising a barrier layer, a quantum dot layer, and a wetting layer, the quantum dot optical amplifier being configured to modulate a phase of the second light beam, configured to amplify an intensity of the second light beam;
a receiver configured to receive the second light beam radiated from the beam steering apparatus toward an object and reflected therefrom; and
a processor configured to classify and process a plurality of light beams irradiated toward the object in a plurality of directions based on at least one of a distribution-by-location and a distribution-by-time of the second light beam received by the receiver.

12. The system of claim 11, wherein the quantum dot optical amplifier further comprises a first electrode layer provided on the barrier layer and a second electrode layer provided on the wetting layer.

13. The system of claim 12, wherein the beam steering apparatus further comprises a first spacer provided between the barrier layer and the first electrode layer, and a second spacer provided between the wetting layer and the second electrode layer.

14. The system of claim 11, wherein the quantum dot optical amplifier is further configured to modulate the phase of the second light beam and amplify the intensity of the second light beam based on a current applied to the quantum dot optical amplifier, the current ranging from $0.1 \times I_{th}$ to $1 \times I_{th}$, where $I_{th}$ is a threshold current.

15. The system of claim 11, wherein, based on a charge supply to the quantum dot optical amplifier reaching a certain level or higher, a carrier density of the quantum dot layer in a ground state is saturated and a substantially constant gain of the quantum dot optical amplifier is maintained, and wherein, based on an increase of a carrier density of the wetting layer, the wetting layer has a refractive index that is changed, upon which the phase of the second light beam is modulated.

16. The system of claim 11, wherein the quantum dot layer comprises a Group III-V semiconductor material.

17. The system of claim 11, wherein the quantum dot layer comprises InAs.

18. The system of claim 11, wherein the wetting layer comprises $In_{0.15}GaAs$.

19. The system of claim 11, wherein, in the quantum dot optical amplifier, the barrier layer, the quantum dot layer, and the wetting layer are repeatedly stacked 2 to 30 times.

\* \* \* \* \*